US008729661B2

(12) United States Patent
Luo et al.

(10) Patent No.: US 8,729,661 B2
(45) Date of Patent: May 20, 2014

(54) SEMICONDUCTOR STRUCTURE AND METHOD FOR MANUFACTURING THE SAME

(75) Inventors: Zhijiong Luo, Poughkeepsie, NY (US); Haizhou Yin, Poughkeepsie, NY (US); Huilong Zhu, Poughkeepsie, NY (US)

(73) Assignee: Institute of Microelectronics, Chince Academy of Sciences, Beijing (CN)

( * ) Notice: Subject to any disclaimer, the term of this patent is extended or adjusted under 35 U.S.C. 154(b) by 177 days.

(21) Appl. No.: 13/379,533

(22) PCT Filed: Apr. 25, 2011

(86) PCT No.: PCT/CN2011/073266
§ 371 (c)(1),
(2), (4) Date: Dec. 20, 2011

(87) PCT Pub. No.: WO2012/094856
PCT Pub. Date: Jul. 19, 2012

(65) Prior Publication Data
US 2012/0273840 A1    Nov. 1, 2012

(30) Foreign Application Priority Data
Jan. 12, 2011    (CN) .......................... 2011 1 0006103

(51) Int. Cl.
*H01L 21/70*    (2006.01)
(52) U.S. Cl.
USPC ......................................... 257/510; 438/296
(58) Field of Classification Search
CPC ................................. H01L 21/768–21/76898
USPC ................ 438/269, 294, 296, 400, 478, 481, 438/FOR. 167, FOR. 221; 257/183, 200, 257/374, 501, 505, 506, E21.09, E21.092, 257/E21.102, E21.115, E21.133, E21.461
See application file for complete search history.

(56) References Cited

U.S. PATENT DOCUMENTS

| 4,923,826 | A  | * | 5/1990 | Jastrzebski et al. ........... 438/154 |
| 6,331,479 | B1 | * | 12/2001 | Li et al. ........................ 438/618 |
| 6,936,509 | B2 |   | 8/2005 | Coolbaugh et al. |
| 2001/0008299 | A1 |   | 7/2001 | Linthicum et al. |
| 2008/0257409 | A1 | * | 10/2008 | Li et al. ......................... 136/259 |

FOREIGN PATENT DOCUMENTS

CN    101300663 A    11/2008

OTHER PUBLICATIONS

International Search Report from PCT/CN2011/073266 dated Oct. 20, 2011 (4 pages).
Written Opinion from PCT/CN2011/073266 dated Oct. 20, 2011 (4 pages).
First Office Action dated Jul. 1, 2013, issued by the State Intellectual Property Office of The People's Republic of China, in related Chinese Patent Application No. 201110006103.5, with an English translation of the Summary (7 pages).

* cited by examiner

*Primary Examiner* — Colleen Matthews
*Assistant Examiner* — Quovaunda V Jefferson
(74) *Attorney, Agent, or Firm* — Oshia Liang LLP

(57) ABSTRACT

A semiconductor structure and a method for manufacturing the same are disclosed. The method comprises: disposing a first dielectric material layer on a first semiconductor layer and defining openings in the first dielectric material layer; epitaxially growing a second semiconductor layer on the first semiconductor layer via the openings defined in the first dielectric material layer, wherein the second semiconductor layer and the first semiconductor layer comprise different materials from each other; and forming plugs of a second dielectric material in the second semiconductor layer at positions where the openings are defined in the first dielectric material layer and also at middle positions between adjacent openings. According to embodiments of the disclosure, defects occurring during the heteroepitaxial growth can be effectively suppressed.

10 Claims, 2 Drawing Sheets

SEMICONDUCTOR STRUCTURE AND METHOD FOR MANUFACTURING THE SAME

CROSS-REFERENCE TO RELATED APPLICATION(S)

This application is a national phase application of, and claims priority PCT Application No. PCT/CN2011/073266, entitled "SEMICONDUCTOR STRUCTURE AND METHOD FOR MANUFACTURING THE SAME," filed on Apr. 25, 2011, which claimed priority to Chinese Application No. 201110006103.5 filed on Jan. 12, 2011. Both the PCT Application and the Chinese Application are incorporated herein by reference in their entireties.

TECHNICAL FIELD

The present disclosure relates to the field of semiconductor, and particularly, to a semiconductor structure comprising a heteroepitaxy structure and a method for manufacturing the same.

BACKGROUND

Generally, heteroepitaxy means epitaxially growing on a crystal material another crystal material, e.g. epitaxially growing germanium (Ge) or group III/V compound semiconductors, etc. on a silicon (Si) substrate. With the continuous development of the semiconductor technology, the heteroepitaxy technology is becoming more and more important. For example, a high-performance Ge-channel Metal Oxide Semiconductor Field Effect Transistor (MOSFET) can be formed by depositing Ge having high carrier mobility as a channel material on a Si substrate. Further, it is possible to facilitate the integration of optoelectronic devices with the Si Complementary Metal Oxide Semiconductor (CMOS) technology by depositing a group III/V compound semiconductor material and the like, for example, on a Si substrate.

However, the lattices of the two crystal materials generally do not match, causing defects such as dislocations during the growth. For example, epitaxially growing more than a few nanometers (nm) of Ge directly on Si can lead to a dislocation density of $10^8$-$10^9$/cm$^2$ due to the lattice mismatch of 4.2% between the two materials. Such defects have negative impacts on the grown crystal and thus a resulting device.

Currently, various methods have been proposed to reduce such defects occurring in heteroepitaxy, e.g. the graded buffer technology, the post-growth high-temperature annealing technology, and the Aspect Ratio Trapping (ART) technology, etc. FIG. 1 is a schematic diagram showing how to reduce the defects by ART. As shown in FIG. 1, a dielectric material (e.g. SiO$_2$) 110 is disposed on a Si substrate 100. The dielectric material 110 has openings with a relatively large Aspect Ratio (AR) defined therein. Then a Ge layer 120, for example, is epitaxially grown on the Si substrate 100. It has been found that defects occurring during the growth such as dislocations are approximately perpendicular to the growing surface. Since the size of the openings defined in the dielectric material 110 is relatively small, the grown Ge material generally has a profile where a middle portion is relative high and side portions are relative low in the respective openings. Namely, the growing surface is not parallel to the substrate surface, so the defects 130 extend upward in oblique directions as shown in FIG. 1. Finally, these defects terminate at the non-crystal dielectric material 110 and thus are prevented from further extending upward.

In other words, during the epitaxial growth, although most of the defects are confined at bottom portions of the openings, the defects still exist. Furthermore, when the semiconductor materials, which are respectively epitaxially grown in adjacent openings, coalesce above the dielectric material 110, coalescence dislocations 140 will occur.

Also, it is known that a SOI (Silicon-On-Insulator) structure helps to improve device performances in many applications. A conventional SOI structure is a semiconductor (e.g. Si)—insulator (e.g. silicon oxide)—semiconductor (e.g. Si) structure, for example. This structure is generally formed by oxidizing surfaces of two separate Si chips respectively, and combining the two Si chips in such a way that the oxidized surfaces face each other. However, there is not an effective process for incorporating the SOI technique in a heterogeneous semiconductor structure, which includes two layers of different semiconductor materials.

SUMMARY

The present disclosure provides, among other things, a semiconductor structure and a method for manufacturing the same, so as to provide a semiconductor arrangement of a first semiconductor layer—an insulator—a second semiconductor layer and also to reduce defects caused during epitaxial growth.

According to an embodiment, there is provided a method for manufacturing a semiconductor structure, comprising: disposing a first dielectric material layer on a first semiconductor layer and defining openings in the first dielectric material layer; epitaxially growing a second semiconductor layer on the first semiconductor layer via the openings defined in the first dielectric material layer, wherein the second semiconductor layer and the first semiconductor layer comprise different materials from each other; and forming plugs of a second dielectric material in the second semiconductor layer at positions where the openings are defined in the first dielectric material layer and also at middle positions between adjacent openings.

According to the embodiment, it is possible to effectively provide a semiconductor structure of a first semiconductor layer—an insulator—a second semiconductor layer. Since the epitaxial growth is performed via the openings defined in the first dielectric material layer, defects occurring during the epitaxial growth, such as dislocations, can be trapped by the first dielectric material layer due to ART. Furthermore, the finally formed plugs of the second dielectric material can further remove defects at bottom portions of the respective openings in the first dielectric material layer and coalescence dislocations formed between adjacent openings above the first dielectric material layer. As a result, there are substantially no defects or very few defects in the second semiconductor layer.

Optionally, the plugs of the second dielectric material can form Shallow Trench Isolations (STIs). In this way, the method according to the present disclosure is compatible with the STI process.

Optionally, the first semiconductor layer may comprise Si, and the second semiconductor layer may comprise Ge or group III/V compound semiconductors.

Optionally, the openings each may have an Aspect Ratio larger than or equal to 1.

Optionally, dislocations, if present in portions of the second semiconductor layer close to the first semiconductor layer, each can terminate at a sidewall of the first dielectric material layer exposed after formation of the openings.

According to a further embodiment, there is provided a semiconductor structure, comprising: a first semiconductor layer; a first dielectric material layer disposed on the first semiconductor layer and having openings defined therein; a second semiconductor layer disposed on the first semiconductor layer and filling the openings, wherein the second semiconductor layer and the first semiconductor material comprise different materials from each other; and plugs of a second dielectric material formed in the second semiconductor layer at positions where the openings are defined in the first dielectric material layer and also at middle positions between adjacent openings.

Optionally, the plugs of the second dielectric material can form Shallow Trench Isolations.

Optionally, the first semiconductor layer may comprise Si, and the second semiconductor layer may comprise Ge or group III/V compound semiconductors.

Optionally, the openings each may have an Aspect Ratio larger than or equal to 1.

Optionally, dislocations, if present in portions of the second semiconductor layer close to the first semiconductor layer, each can terminate at a sidewall of the first dielectric material layer exposed after formation of the openings.

Likewise, the semiconductor structure according to the present disclosure can also achieve features and advantages as described with respect to the method according to the present disclosure.

BRIEF DESCRIPTION OF THE DRAWINGS

The above and other objects, features, and advantages of the present invention will become apparent from the following descriptions on embodiments of the present invention with reference to the drawings, in which.

DETAILED DESCRIPTION

Figure 1:
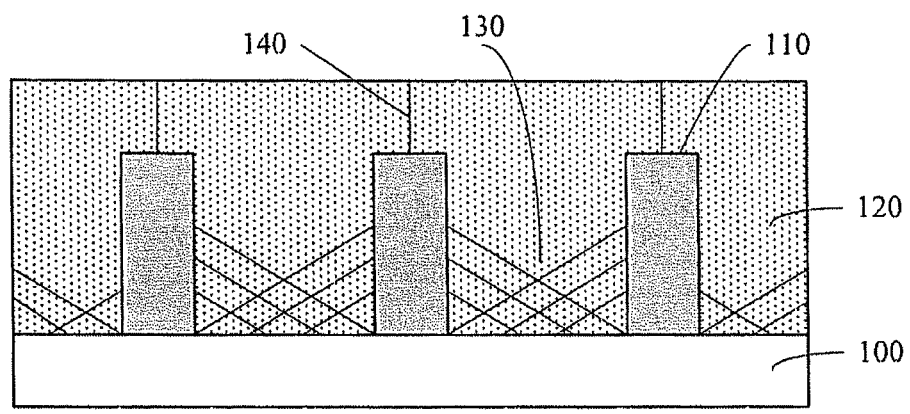
FIG. 1 is a diagram showing a heteroepitaxy growing method according to the prior art.

Next, the present invention will be described with reference to specific embodiments shown in the drawings. However, it should be understood that these descriptions are only illustrative and are not intended to limit the scope of the present invention. Further, in the following, explanations on well-known structures and technologies are omitted, in order not to unnecessarily obscure the concept of the present invention.

In the drawings, various layer structures according to embodiments of the present invention are schematically shown. However, they are not drawn to scale, and some features may be enlarged while some features may be omitted for purpose of clarity. Shapes, sizes and relative positions of respective regions and layers are only illustrative, and deviations therefrom may occur due to manufacture tolerances and technical limits. Those skilled in the art can otherwise design regions/layers of different shapes, sizes, or relative positions according to actual requirements.

Figure 2:
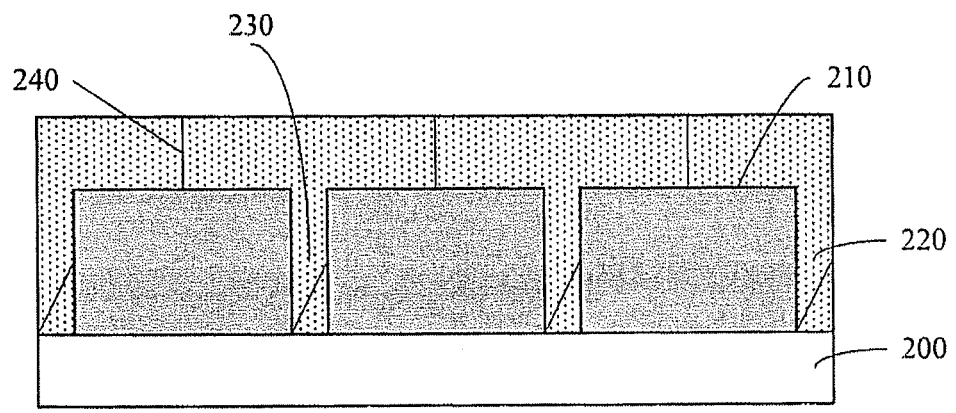
FIGS. 2-4 are schematic sectional views showing structures obtained in respective stages of a flow for manufacturing a semiconductor structure according to an embodiment of the present disclosure.

As shown in FIG. 2, heteroepitaxy is performed firstly. In particular, for example, a first semiconductor layer is provided. The first semiconductor layer may be a semiconductor substrate 200. The semiconductor substrate may comprise Si or Ge, etc. In other embodiments, the first semiconductor layer may comprise any one of: any semiconductor material, such as SIC, formed on the semiconductor substrate 200; any semiconductor material formed on another substrate such as glass; group III/V compound semiconductors such as GaAs and InP; and group II/VI compound semiconductors such as ZnSe and ZnS.

Next, the present disclosure will be described by taking the Si substrate as an example. However, it does not mean that the present disclosure is limited thereto.

A first dielectric material layer 210 is formed on the semiconductor substrate 200. The first dielectric material layer 210 may comprise an insulating material commonly used in the art, such as silicon oxide and silicon nitride. The first dielectric material layer 210 is patterned to define openings therein. These openings each may have a relatively large Aspect Ratio (AR). For example, the AR may be larger than 1, so that growth defects can be sufficiently confined at bottom portions of the openings during a subsequent epitaxial growth. Furthermore, the openings each may have a width (in a horizontal direction in the drawings) relatively small, to correspond to, for example, that of a Shallow Trench Isolation (STI) in the conventional process.

Next, a second semiconductor material 220, such as Ge, which is different from the first semiconductor material, is epitaxially grown on the semiconductor substrate 200. In particular, the second semiconductor material 220 is grown via the openings defined in the first dielectric material layer 210. Certainly, the second semiconductor material is not limited to Ge, but may also comprise any of group IV compound semiconductors such as SiGe and SiC, group III/V compound semiconductors such as GaAs and InP, and group II/VI compound semiconductors such as ZnSe and ZnS. Typically, there is a lattice mismatch between the second semiconductor material and the first semiconductor material.

The second semiconductor material may be epitaxially grown in various ways, such as Metal Organic Chemical Vapor Deposition (MOCVD), Low Pressure Chemical Vapor Deposition (LPCVD), Molecular Beam Epitaxy (MBE), and Atom Layer Deposition (ALD). The epitaxial growth process is well known per se, and detailed descriptions thereof are omitted.

As described above, the epitaxial growth causes various defects, such as dislocations 230 confined at the bottom portions of the openings and coalescence dislocations 240 between adjacent openings. These defects will affect performances of a resulting device to some extent.

Figure 3:
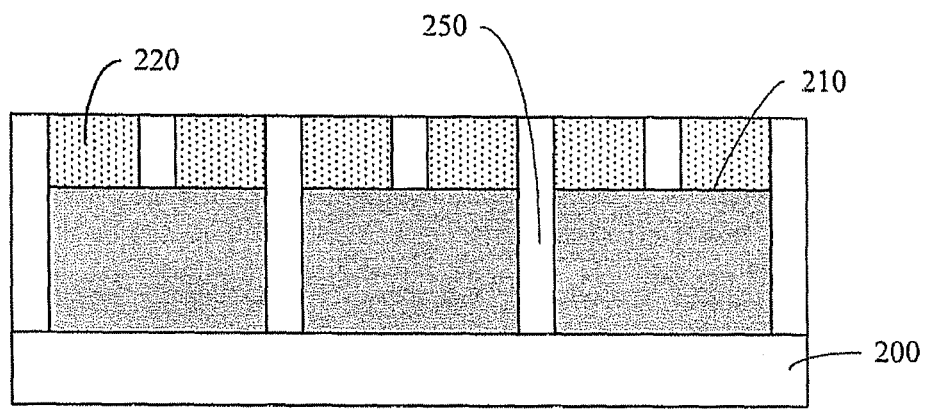

Then, in the epitaxially grown second semiconductor material 220 (the second semiconductor layer), trenches 250 are formed by etching, for example, at positions, which correspond to the openings defined in the first dielectric material layer 210 and the coalescence dislocations between adjacent openings, as shown in FIG. 3. Typically, the coalescence dislocations are positioned substantially midway between adjacent openings in the first dielectric material layer 210. For example, each of the coalescence dislocations can fall into a region symmetric with respect to and centered at a middle position between corresponding adjacent openings. The region may have a size dependent on process requirements. For example, the region may correspond to a Shallow Trench Isolation for isolating respective semiconductor devices to be formed on the second semiconductor layer. Therefore, in the second semiconductor material 220, generally the trenches 250 can be formed at positions where the openings are defined in the first dielectric material layer 210 and also at middle positions between adjacent openings. As can be seen from FIG. 3, due to the formation of the trenches 250, the defects occurring during the epitaxial growth, such as the defects 230 and 240 as shown in FIG. 2, are mostly removed. Here, defects, such as dislocations, if present in portions of the second semiconductor layer close to the first semiconductor layer, each can terminate at a sidewall of the first dielectric material layer exposed by the formation of the openings. Advantageously, the first dielectric material layer 210 can trap the defects, and the defects trapped by the first dielectric material layer 210 will be completely removed by the formation of the trenches 250.

Figure 4:
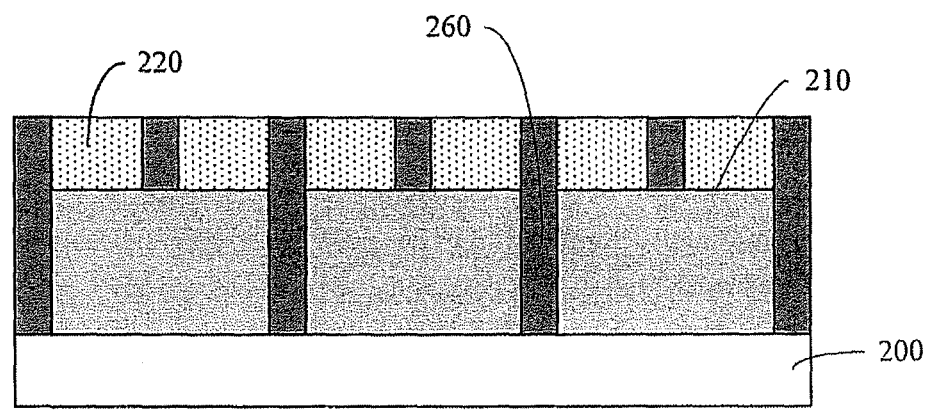

Next, as shown in FIG. 4, a second dielectric material 260 can be filled into the trenches 250. The second dielectric material 260 may be or may not be the same as the material of the first dielectric material layer 220. The filling process may be performed by depositing the dielectric material and then planarizing (e.g. CMP) or back-etching it. The second dielectric material 260 may comprise an insulating material commonly used in the art, such as silicon oxide and silicon nitride.

Thus, a semiconductor structure according to an embodiment of the present disclosure is obtained. As shown in FIG. 4, the semiconductor structure comprises: a first semiconductor layer 200; a first dielectric material layer 210 disposed on the first semiconductor layer 200 and having openings defined therein; a second semiconductor layer 220 disposed on the first semiconductor layer and filling the openings, and plugs 260 of a second dielectric material formed in the second semiconductor layer 220 at positions where the openings are defined in the first dielectric material layer 210 and also at middle positions between adjacent openings.

Optionally, the plugs 260 of the second dielectric material may be used as STIs. The plugs 260 may be formed by any suitable method for forming STIs in conventional processes. Optionally, the first semiconductor layer may comprise Si, and the second semiconductor layer may comprise Ge or group III/V compound semiconductors. Optionally, the openings each can have an AR larger than or equal to 1. Optionally, dislocations, if present in portions of the second semiconductor layer close to the first semiconductor layer, each can terminate at a sidewall of the first dielectric material layer exposed after formation of the openings.

Furthermore, in the semiconductor structure shown in FIG. 4, the second semiconductor layer 220 is disposed on the first dielectric material layer 210 and isolated by the plugs 260 (STIs). Thus, the semiconductor structure is similar to a SOI structure, except that the semiconductor structure comprises an arrangement of a first semiconductor layer (e.g. Si)—a dielectric material layer (e.g. an insulating material such as silicon oxide or silicon nitride)—a second semiconductor layer (e.g. Ge) of a material different from that of the first semiconductor layer. Therefore, the semiconductor structure according to the present disclosure can also achieve various advantages as presented by the SOI structure.

The structural compositions, materials, and forming methods of the respective parts in the respective embodiments of the semiconductor structure may be the same as those described in the above-described method embodiments for forming the semiconductor structure, and thus detailed descriptions thereof are omitted.

In the above description, details of patterning and etching of the respective layers are not provided. It is to be understood by those skilled in the art that various means in the prior art may be utilized to form the layers and regions in desired shapes. Further, to achieve the same feature, those skilled can devise different methods than those described above. Although the respective embodiments are described respectively above, it does not necessarily mean that advantageous features of those embodiments cannot be used in combination.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall into the scope of the invention.

We claim:

1. A method for manufacturing a semiconductor structure, comprising:
    disposing a first dielectric material layer on a surface of a first semiconductor layer, and defining openings in the first dielectric material layer to expose portions of the surface of the first semiconductor layer;
    epitaxially growing a second semiconductor layer on the exposed portions of the surface of the first semiconductor layer via the openings defined in the first dielectric material layer, such that portions of the second semiconductor layer grows via adjacent openings coalescing with each other on a top surface of the first dielectric material layer, wherein the second semiconductor layer and the first semiconductor layer comprise different materials from each other; and
    forming plugs of a second dielectric material in the second semiconductor layer at positions where the openings are defined in the first dielectric material layer and also at middle positions between adjacent openings, wherein the plugs pass through the second semiconductor layer to reach the surface of the first semiconductor layer or the top surface of the first dielectric material layer.

2. The method according to claim 1, wherein the plugs of the second dielectric material form Shallow Trench Isolations.

3. The method according to claim 1, wherein the first semiconductor layer comprises Si, and the second semiconductor layer comprises Ge or group III/V compound semiconductors.

4. The method according to claim 1, wherein the openings each have an Aspect Ratio larger than or equal to 1.

5. The method according to claim 1, wherein dislocations, if present in portions of the second semiconductor layer close to the first semiconductor layer, each terminates at a sidewall of the first dielectric material layer exposed after formation of the openings.

6. A semiconductor structure, comprising:
    a first semiconductor layer;
    a first dielectric material layer disposed on the first semiconductor layer and having openings defined therein;
    a second semiconductor layer disposed on the first semiconductor layer and filling the openings, and extending over a top surface of the first dielectric material layer, wherein the second semiconductor layer and the first semiconductor material comprise different materials from each other; and
    plugs of a second dielectric material formed in the second semiconductor layer at positions where the openings are defined in the first dielectric material layer and also at middle positions between adjacent openings, wherein the plugs pass through the second semiconductor layer to reach the surface of the first semiconductor layer or the top surface of the first dielectric material layer.

7. The semiconductor structure according to claim 6, wherein the plugs of the second dielectric material form Shallow Trench Isolations.

8. The semiconductor structure according to claim 6, wherein the first semiconductor layer comprises Si, and the second semiconductor layer comprises Ge or group III/V compound semiconductors.

9. The semiconductor structure according to claim 6, wherein the openings each have an Aspect Ratio larger than or equal to 1.

10. The semiconductor structure according to claim 6, wherein dislocations, if present in portions of the second semiconductor layer close to the first semiconductor layer, each terminates at a sidewall of the first dielectric material layer exposed after formation of the openings.

* * * * *